United States Patent [19]

Weissenberger

[11] Patent Number: 5,451,877
[45] Date of Patent: Sep. 19, 1995

[54] METHOD FOR THE COMPENSATION OF EDDY CURRENTS CAUSED BY GRADIENTS IN A NUCLEAR MAGNETIC RESONANCE APPARATUS

[75] Inventor: Volker Weissenberger, Erlangen, Germany

[73] Assignee: Siemens Aktiengesellschaft, Munich, Germany

[21] Appl. No.: 226,323

[22] Filed: Apr. 12, 1994

[30] Foreign Application Priority Data

Apr. 23, 1993 [DE] Germany .................. 43 13 392.4

[51] Int. Cl.⁶ .............................................. G01V 3/00
[52] U.S. Cl. ...................................... 324/322; 324/312
[58] Field of Search ............... 324/309, 307, 300, 312, 324/318, 322; 128/653.5

[56] References Cited

U.S. PATENT DOCUMENTS

| | | | |
|---|---|---|---|
| 4,284,950 | 8/1981 | Burl et al. | 324/320 |
| 4,585,995 | 4/1986 | Flugan | 324/318 |
| 4,698,591 | 10/1987 | Glover et al. | 324/307 |
| 4,703,275 | 10/1987 | Holland | 324/322 |
| 4,749,948 | 6/1988 | Duby et al. | 324/320 |
| 4,910,460 | 3/1990 | Sebok | 324/307 |

OTHER PUBLICATIONS

"NMR Imaging Techniques and Applications: A Review", Rev. Sci. Instrum., 53(9), 1982, pp. 1319–1337.

*Primary Examiner*—Louis M. Arana
*Attorney, Agent, or Firm*—Hill, Steadman & Simpson

[57] ABSTRACT

In a method for the compensation of eddy currents caused by gradients in nuclear magnetic resonance apparatus a gradient pulse is activated and a nuclear magnetic resonance signal is excited in a slice of a spatially extended phantom, the nuclear magnetic resonance signal is acquired after the end of the gradient pulse and during the decay time of the eddy currents caused by said gradient pulse and the eddy current magnetic field is identified from the phase curve of this nuclear magnetic resonance signal. A filter for the gradient system that generates the gradient pulse is calculated on the basis of the eddy current magnetic field identified in this way.

11 Claims, 6 Drawing Sheets

METHOD FOR THE COMPENSATION OF EDDY CURRENTS CAUSED BY GRADIENTS IN A NUCLEAR MAGNETIC RESONANCE APPARATUS

BACKGROUND OF THE INVENTION

1. Field of the Invention

The present invention is directed to a method for compensating eddy currents caused by gradients in a nuclear magnetic resonance apparatus.

2. Description of the Prior Art

As is known, a topical resolution of the nuclear magnetic resonance signals in nuclear magnetic resonance tomography ensues by superimposing a magnetic field gradient on a homogenous, static basic field on the order of magnitude of 1 T. The principles of such imaging are set forth, for example, in the article by Bottomley, "NMR-Imaging Techniques and Applications: A Review", in Review of Scientific Instrumentation, 53 (9), 9/1982, pages 1319 through 1337.

Figure 1:
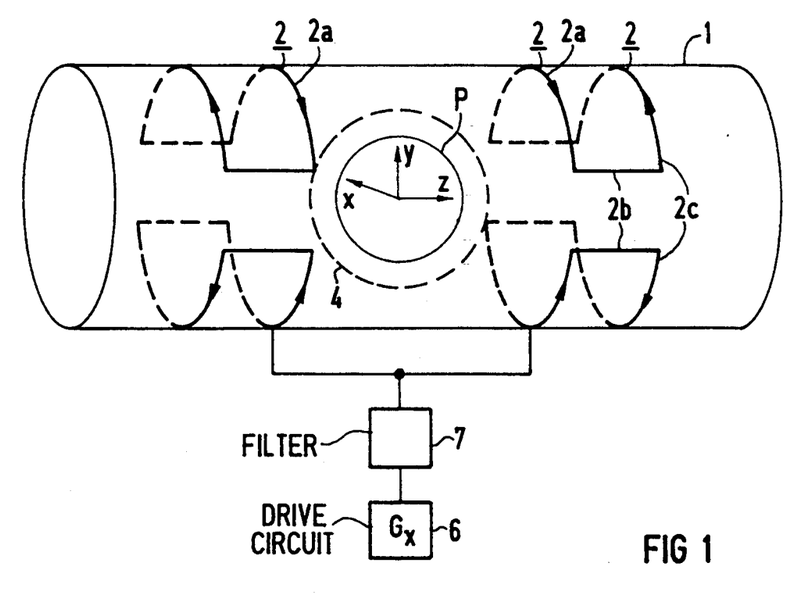
FIGS. 1 and 2 are schematic representations of respective gradient coil systems for generating magnetic field gradients in the y-direction and the z-direction in a magnetic resonance imaging apparatus, which not only serve to illustrate the problem, as discussed above, to which the method of the invention is directed, but also serve as examples of the type of systems which can be used to implement the inventive method.

For topical resolution in three dimensions, magnetic field gradients must be produced in three directions that preferably reside perpendicularly relative to one another. A coordinate cross x, y, z is entered in FIG. 1 and in FIG. 2 herein, representing the directions of the respective gradients. FIG. 1 schematically shows a conventional arrangement of gradient coils for generating a magnetic field gradient Gy in y-direction. The gradient coils 2 are executed as saddle coils that are secured on a carrying tube 1. A substantially constant magnetic field gradient Gy in the y-direction is generated within a spherical examination volume 4 by the conductor sections 2a. The return conductors—due to their greater distance from the examination volume 4, produce only negligible magnetic field components therein.

The gradient coils for the x-magnetic field gradients are identically constructed to the gradient coils 2 for the y-magnetic field gradients and are merely rotated on the carrying tube 1 by 90° in the azimuthal direction. For clarity, they are therefore not shown in FIG. 1.

Figure 2:
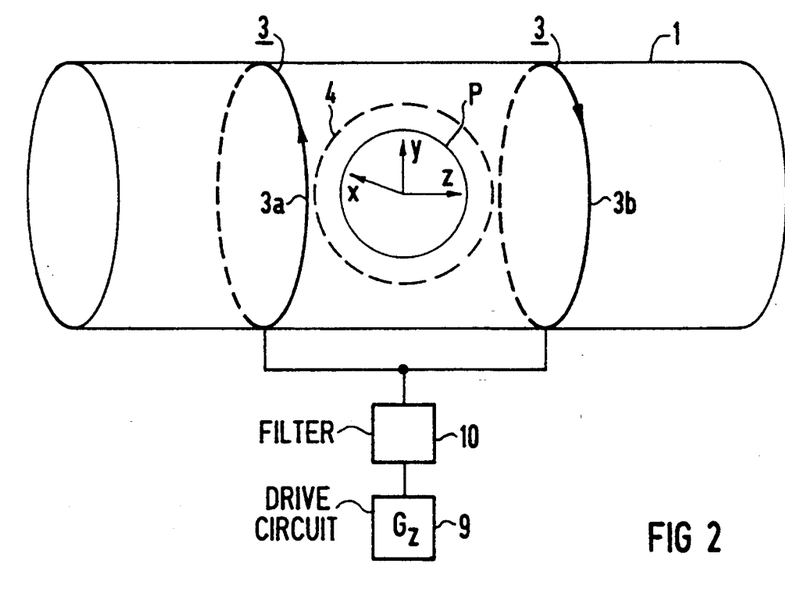

The gradient coils 3 for the magnetic field gradient in the z-direction are schematically shown in FIG. 2. The coils are annularly executed and symmetrically arranged relative to the center of the examination volume 4. Since the two individual coils 3a and 3b are traversed by current in opposite directions in the way shown in FIG. 2, they cause a magnetic field gradient in the z-direction.

Figure 3:
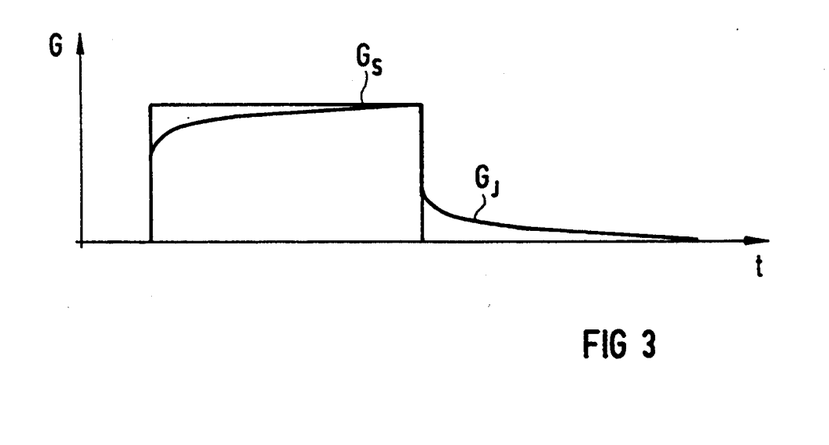
FIG. 3 shows respective gradient curves for illustrating the problem caused by the presence of eddy currents, for which the inventive method is intended as a solution.

The required magnetic field gradients must have steep leading and trailing edges and must be optimally constant during the on-time. As a result of the steep leading and trailing edges, however, eddy currents are induced in metallic parts of the nuclear magnetic resonance tomography apparatus, particularly in the inner hollow cylinder of the cryostat that surrounds the examination space. The eddy currents in turn generate magnetic fields that are directed oppositely to the magnetic field gradients. This leads to a rounding the corners of the desired square-wave pulses and also causes a parasitic magnetic field that decays after the magnetic field gradients are turned off. This is shown in FIG. 3, wherein the desired square-wave magnetic field gradient is referenced $G_s$. The gradient curve actually achieved when an approximately square-wave current pulse is turned off is referenced $G_i$.

U.S. Pat. No. 4,698,591 discloses deformation of the gradient current pulse with a filter such that the magnetic field gradient is ultimately largely approximated to the desired square-wave form. As shown in FIGS. 1 and 2, such a filter 7 or 10 is inserted between the drive circuit 6 or 9 and each of the respective gradient coils 2 or 3. These filters are high-pass filters. For determining the parameters required for the filter, the magnetic fields caused by the eddy currents must first be measured. This, for example, can ensue with a magnetic field probe with which the magnetic field actually generated is measured at various points in the examination space. To that end, however, a separate measuring instrument is required.

The aforementioned U.S. Pat. No. 4,698,591 discloses a method of measuring the magnetic field course with the nuclear magnetic resonance signals induced in a sample. Since the measurement of the magnetic field is required at at least two locations of the examination space, the sample must be moved back and forth between two measuring positions for every measuring cycle.

SUMMARY OF THE INVENTION

It is an object of the present invention to provide a method for the compensation of eddy currents in a nuclear magnetic resonance apparatus such that a change in location of the sample can be avoided.

The above object is achieved in accordance with the principles of the present invention in a method for compensating for eddy currents caused by switched magnetic field gradients in a nuclear magnetic resonance apparatus, wherein a spatially extended phantom is brought into the examination region of the apparatus and a first gradient pulse is activated. A first frequency-selective radio-frequency pulse is activated under the influence of a slice selection gradient pulse so as to excite nuclear spins in a slice of the phantom. The nuclear magnetic resonance signal arising as a result of the nuclear spins is then acquired at the end of the first gradient pulse and during the decay time of the eddy currents caused by that gradient pulse. Either the frequency curve or the phase curve of the nuclear magnetic resonance signal is identified. The above steps are then repeated with a different position of the selected slice. The eddy current magnetic field generated by the eddy currents is then calculated from the frequency curve or from the phase curve acquired in this manner, from which parameters for a filter for the gradient system used to generate the first gradient pulse are calculated. Based on these parameters, a filter is then constructed for operating on the current supplied to the gradient system for generating the magnetic pulse so as to "pre-distort" the current, and thus to pre-distort the pulse, to an extent such that the resultant gradient magnetic field exhibits the desired pulse shape, i.e., a rectangular pulse, with the eddy currents being taken into consideration.

The first gradient pulse may be simultaneously used as the slice selection gradient.

DESCRIPTION OF THE PREFERRED EMBODIMENTS

In any nuclear magnetic resonance apparatus, the curve of the magnetic fields B(t) caused by the eddy currents can be presented as follows:

$$B(t) = B_0(t) + G_x(t)x + G_y(t)y + G_z(t)z + O(t, x^2, z^2)$$

wherein $B_0(t)$ is the location-independent term of the zero order, $G_x$, $G_y$, $G_z$ are the terms of the first order, and $O(t, x^2, y^2, z^2)$ is the term of the second order.

The terms $G_x$, $G_y$, $G_z$ of the first order thereby dominate. Only these terms can be compensated with an eddy current compensation technique, and they therefore must be exactly measured. The terms of a higher order, particularly of the third order, can not be compensated and are of significance only for greater distances from the center. The location-independent term of the first order $B_0(t)$ is generally small and can arise, for example, from the asymmetrical arrangement of the gradient coils in the magnet or from other effects that disturb the symmetry. It is adequate for identifying the terms of the zero and first order to measure the magnetic field arising from the eddy currents for each direction x, y, z at two points spatially separated in the respective direction.

Figure 4:
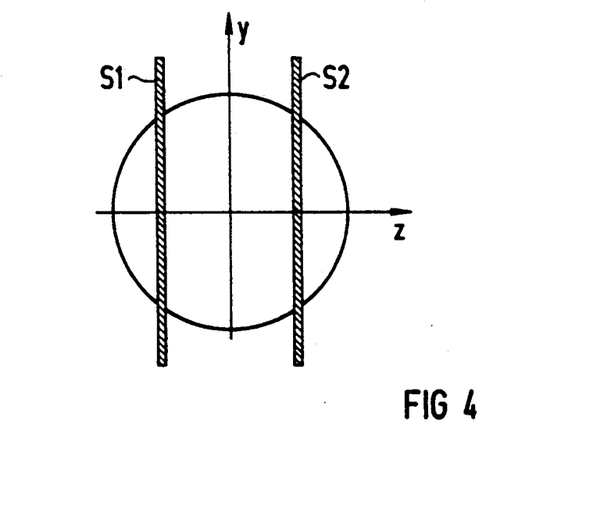
FIG. 4 is a schematic illustration of spatially separated slices which are generated in an examination region in accordance with the principles of the inventive method.

It is known to employ a spatially extended phantom in nuclear magnetic resonance apparatuses for other test and setting purposes. In accordance with the invention, a spatially extended phantom is introduced into the examination space for use in obtaining magnetic field measurements for the purpose of eddy current compensation. Such a phantom is referenced P in FIGS. 1 and 2. Two spatially distanced slices S1 and S2 are then selectively excited for each coordinate direction x, y, z, as shown in FIG. 4 for the z-direction. Nuclear magnetic resonance signals are read out from the selectively excited slices S1 and S2, the strength of the magnetic field caused by the eddy currents within these slices S1 and S2 being identified with the assistance of these nuclear magnetic resonance signals.

Figure 5:
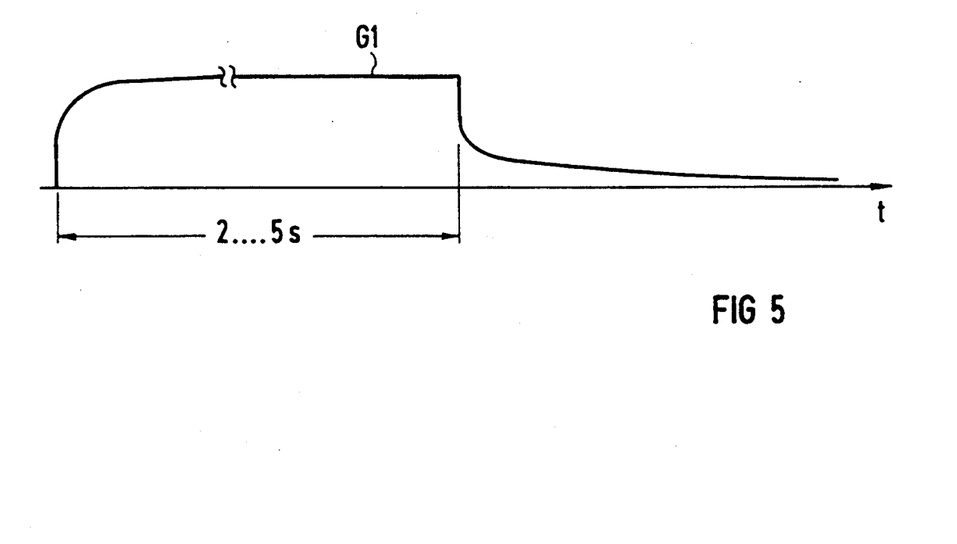
FIGS. 5 and 6 respectively show signal curves for illustrating the basic version of an eddy current magnetic field compensation method in accordance with the principles of the present invention.
Figure 6:
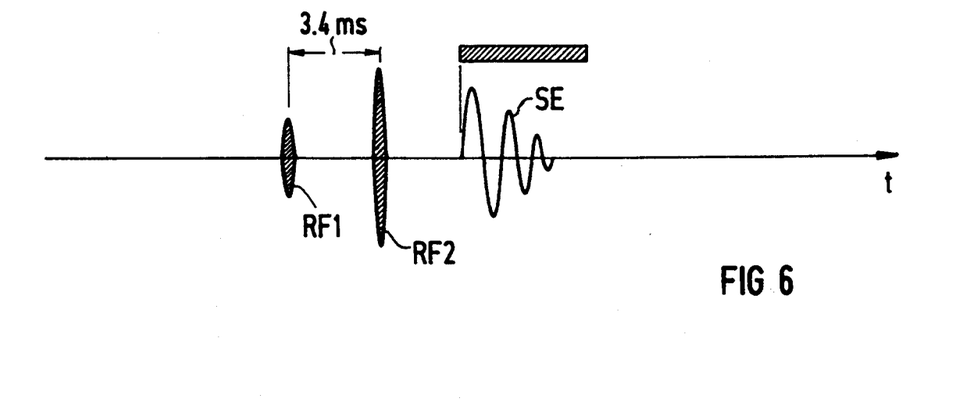

FIGS. 5 and 6 show a first possibility for an appropriate pulse sequence. A gradient pulse G1 having a duration of, for example, 2 through 5 seconds is first activated. Under the influence of the gradient G1, a 90° radio-frequency pulse RF1 is first activated—as shown in FIG. 6—and a 180° radio-frequency pulse RF2 is then activated. In the exemplary embodiment, the interval between the two radio-frequency pulses is approximately 3.4 ms. As a result of the 90° radio-frequency pulse RF1 and the following 180° radio-frequency pulse RF2, a spin echo SE arises that is sampled in the interval identified in FIG. 6 by a hatched bar. The spin echo is chronologically positioned such on the basis of an appropriate position of the radio-frequency pulses RF1 and RF2 such that it lies in the region of the eddy currents triggered by the trailing edge of the gradient pulse U1. As is known, the radian frequency $\omega$ of nuclear magnetic resonance signals is proportional to the respectively prevailing magnetic field strength B via the gyromagnetic relationship $\gamma$:

$$\omega = \gamma \cdot B$$

In order to identify the chronological curve of the magnetic field strength caused by eddy currents, the phase of the received echo signal SE is identified, which in turn identifies a frequency that is equal to the sum of the frequency due to the static magnetic field and a frequency shift. The frequency shift is proportional to the magnetic field caused by eddy currents.

The pulse sequence according to FIGS. 5 and 6 must be implemented for each gradient direction x, y, z for each of the two slices S1 and S2. The linear field terms of the eddy current magnetic fields can then be identified from the acquired measured values and the filter parameters for the pre-distortion of the gradient pulses can be calculated so that a filter for filtering the current supplied to the coil or coils for generating the particular gradient pulse can be constructed. Known techniques can be used with respect to the fashioning of filters and the identification of corresponding parameters on the basis of the identified eddy current magnetic fields. For example, techniques described in "Analytical Method For the Compensation of Eddy-current Effects Induced by Pulsed Magnetic Field Gradients in NMR Systems," Journal of Magnetic Resonance 90, PP. 264 through 278 (1990) and U.S. Pat. No. 4,978,919 can be used.

The above-described pulse sequence of FIGS. 5 and 6 can be employed for measuring eddy current magnetic fields up to 6 through 15 ms after a gradient pulse. In order to acquire eddy current magnetic fields in a longer time span, a pulse sequence according to FIGS. 7 and 8 can be employed.

Figure 7:
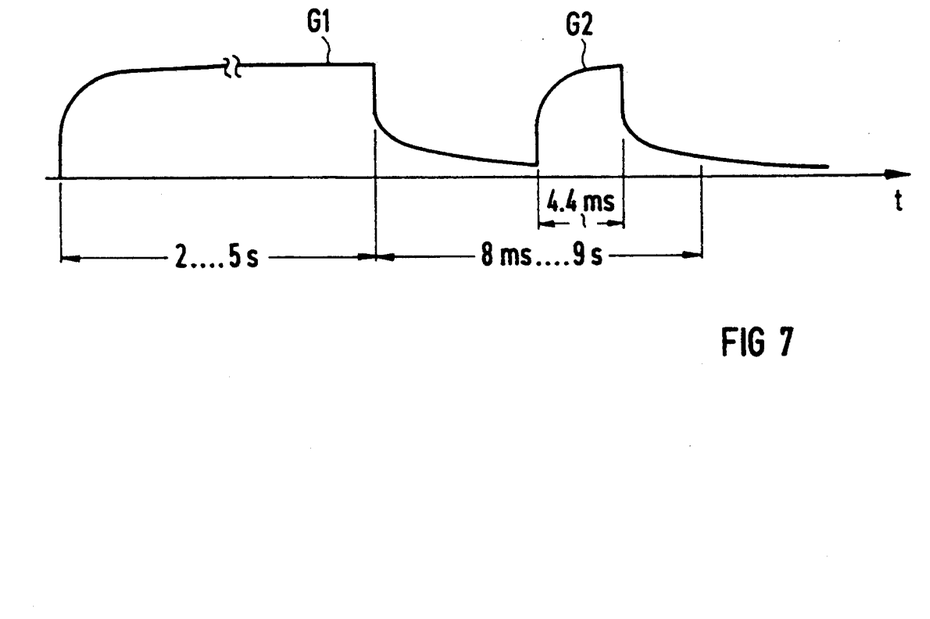
FIGS. 7 and 8 respectively illustrate signals employed in a further embodiment of the method of FIGS. 5 and 6.
Figure 8:
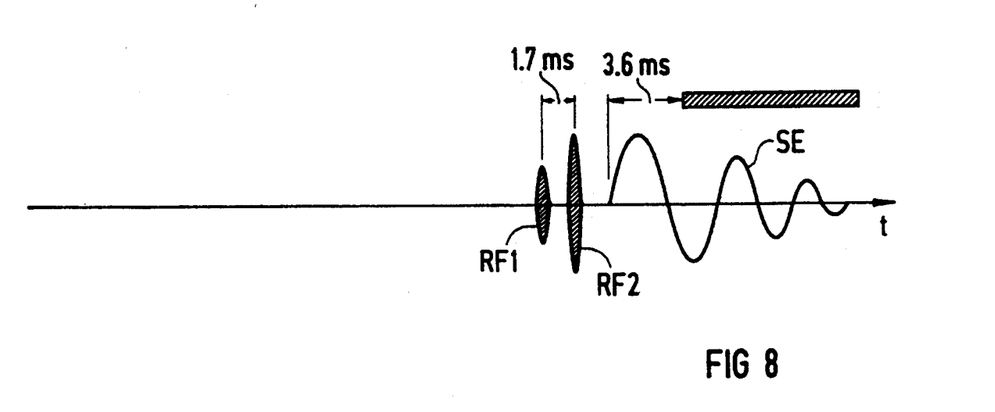

According to the pulse sequence of FIGS. 7 and 8, a separate slice selection gradient G2 can be employed after the gradient G1 that triggers the eddy currents. At a spacing of, for example, 1.7 ms, a frequency-selective 90° radio-frequency pulse RF1 is first activated under this slice selection gradient G2 having a length of, for example, 4.4 ms and a 180° radio-frequency pulse RF2 is then be activated under this slice selection gradient G2. Additional eddy currents are in fact caused by the slice selection pulse G2, these being superimposed on the eddy currents caused by the gradient pulse G1 and thus disturbing the measurement. By keeping the slice selection gradient G2 having a length, for example, of 4.4 ms extremely short compared to the first gradient G1 having a duration of, for example, 2 through 5 seconds, the eddy current triggered by the slice selection gradient G2 remains slight. Given short gradient pulses, the eddy currents triggered by the positive and negative edges largely compensate at least in the longer time span. Since the sampling interval shown shaded in FIG. 8 only begins a few ms after the end of the slice selection gradient G2, the stronger eddy current components are not disturbing in the short time span.

Figure 9:
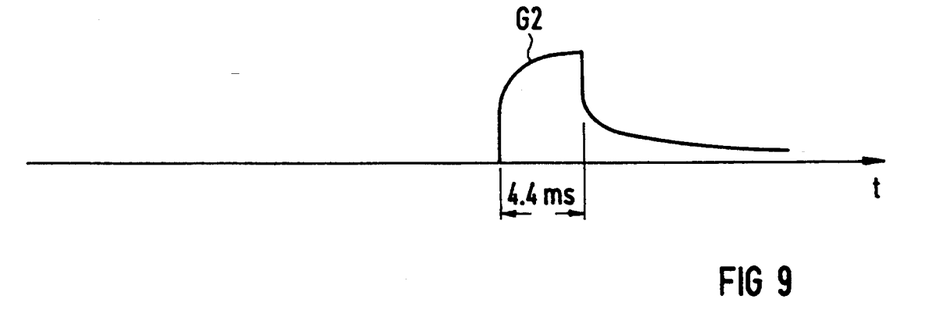
FIGS. 9 and 10 respectively illustrate signals employed in another embodiment of the method of FIGS. 5 and 6.
Figure 10:
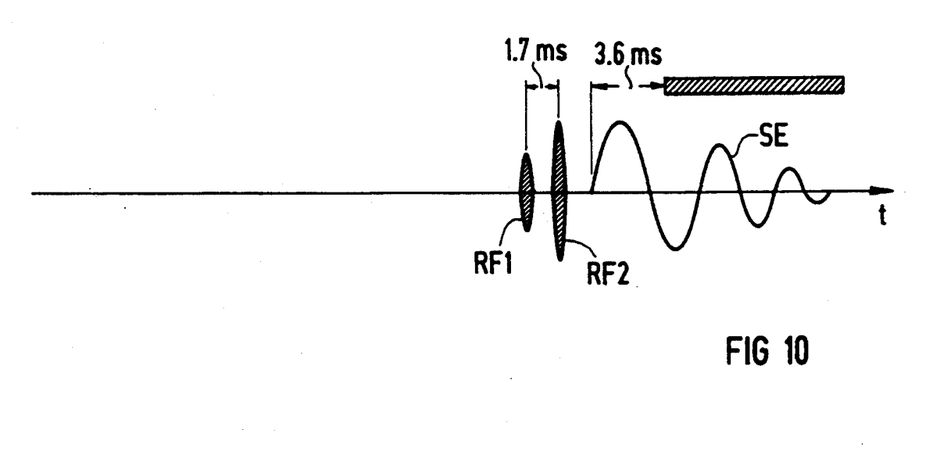

In order nonetheless to compensate remaining eddy current components of the slice selection gradient G2, a reference measurement according to FIGS. 9 and 10 without the gradient G1 can be implemented. The respective frequencies are identified from the phase for the measurement with the pulse sequence according to FIGS. 7 and 8 as well as for the reference measurement. By forming the difference of the frequencies acquired in this way, the effect of the eddy currents caused by the short slice selection gradient G2 can be eliminated and the frequency curve that is caused by the eddy currents of the first gradient G1 is thus obtained.

In order to cover the full time span of the eddy currents, which extends in a range from ms to seconds, the measurement of FIGS. 7 and 8 can be multiply repeated with different spacings between the gradients G1 and G2. When this spacing is greater than the relaxation times T1 and T2 of the nuclear spins in the phantom employed, a plurality of spin echoes can be excited after a gradient pulse G1.

The above-recited measurements must be implemented for each of the two slices for each gradient direction in order to identify terms of the first order of the eddy current magnetic fields. This is adequate for the eddy current compensation. In principle, however, higher terms can also be identified by measuring a plurality of slices.

Inhomogeneities of the basic magnetic field can cause the excited slices to respectively have nuclear spins with different basic frequencies. This could falsify the measured result for the eddy currents. If this error is disturbing, the basic frequency for the respective slice positions must be identified without influence of eddy currents. This likewise ensues with the assistance of spin echoes, however, care must be exercised to insure that eddy currents that are triggered by the required slice selection gradients do not falsify the measured result. This can essentially be achieved by adopting three measures, namely by employing optimally short slice selection gradients, by adding negative gradient pulses, and by long echo times. As already set forth above, only eddy currents having short time constants are excited by short slice selection gradients. The eddy currents of the positive and negative pulses approximately cancel due to additions of negative pulses, and long echo times result in the eddy currents generated by the slice selection gradients have already substantially decaying.

Figure 11:
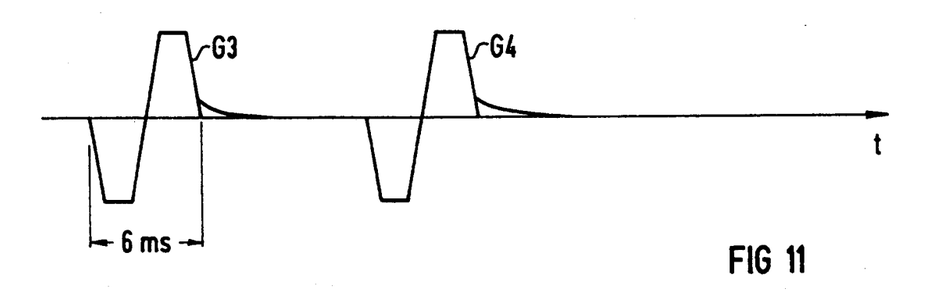
FIGS. 11 and 12 respectively illustrate signals which can be used to augment the signals of any of FIGS. 5 and 6, 7 and 8, or 9 and 10, to compensate for inhomogeneities of the basic magnetic field.
Figure 12:
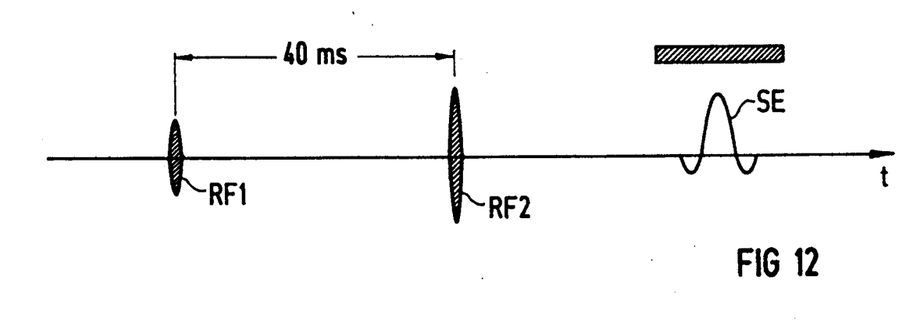

An appropriate pulse sequence for identifying the basic frequency in a slice of the phantom is shown in FIGS. 11 and 12. The phantom is subjected to a frequency-selective 90° radio-frequency pulse RF1 under a first, bipolar slice selection gradient G3. A second radio-frequency pulse RF2 is activated under a second, bipolar slice selection gradient G4. The spin echo is read out and the frequency thereof is identified at an optimally large spacing from the second slice selection gradient G4. This procedure must be implemented for every slice in which the eddy current magnetic fields are to be identified. The measured frequency values thus obtained are subtracted from the frequencies obtained under the influence of the gradient G1 of FIGS. 5 and 6, so that magnetic field inhomogeneities do not falsify the measured result for the eddy current magnetic fields.

Magnetic field inhomogeneities in the above-described pulse sequence of FIGS. 7 and 8, or FIGS. 9 and 10 can also be compensated with the pulse sequence of FIGS. 11 and 12.

In another version of the inventive method for eliminating the influence of different strengths of the basic magnetic field in the measured slices, the measurement of FIGS. 5 and 6, or the measurement of FIGS. 7 and 8, is repeated with negative gradient pulses and the frequency difference thereby obtained is identified. The measuring time is, however, thus lengthened.

The method that has been set forth employs slice selection gradients for which certain minimum quality demands are made. The eddy currents caused by the slice selection gradients therefore cannot already be excessively high at the beginning of the measurement. A pre-compensation on the basis of other methods may be possibly required. Given, for example, actively shielded gradient coils, the uncompensated eddy currents are adequately slight in order to be able to directly apply the above-described method.

The particular advantage of the method is that an eddy current compensation can be implemented and checked without special equipment such as measuring probes and mounts. The required phantom is already present at every MR system for other adjustment and testing purposes. The manipulation of the method is simple, since the phantom need not be moved for the measurement.

Further, whether additional components such as, for example, a surface coil, lead to additional eddy currents can be identified in a simple way.

Although modifications and changes may be suggested by those skilled in the art, it is the intention of the inventors to embody within the patent warranted hereon all changes and modifications as reasonably and properly come within the scope of their contribution to the art.

I claim as my invention:

1. A method for compensating for eddy currents caused by switched magnetic field gradients in a nuclear magnetic resonance apparatus, comprising the steps of:
   (a) placing a spatially extended phantom in an examination region of a nuclear magnetic resonance apparatus, said spatially extended phantom simultaneously extending to two spatially distanced points in said examination region;
   (b) generating a first gradient pulse in said examination region using a gradient system which generates a gradient current creating said first gradient pulse, said first gradient pulse causing the generation of eddy currents having a decay time following an end of said first gradient pulse, said eddy currents having an eddy current magnetic field associated therewith;
   (c) subject said spatially extended phantom to a first, frequency-selective radio-frequency pulse under the influence of a slice selection gradient pulse and thereby exciting nuclear spins in a selected slice of said spatially extended phantom containing one of said points, said nuclear spins producing a nuclear magnetic resonance signal;
   (d) acquiring said nuclear magnetic resonance signal after said end of said first gradient pulse and during said decay time of said eddy currents;

(e) identifying one of a frequency curve or a phase curve of said nuclear magnetic signal;

(f) repeating steps (b) through (e) with a different position of said selected slice containing the other of said points without moving said spatially extended phantom;

(g) calculating said eddy current magnetic field associated with said eddy currents from said frequency curve or said phase curve; and (h) calculating parameters for a filter for filtering said current of said gradient system for generating said first gradient pulse on the basis of said eddy current magnetic field and constructing said filter for pre-distorting said current for producing said first gradient pulse with a desired shape with said eddy currents compensated.

2. A method as claimed in claim 1 wherein steps (b) and (c) are further defined by using said first gradient pulse as said slice selection gradient.

3. A method as claimed in claim 1 wherein step (c) is further defined by activating said slice selection gradient together with said first frequency-selective radio-frequency pulse after said first gradient pulse, said slice selection gradient having a duration which is substantially shorter than a duration of said first gradient pulse.

4. A method as claimed in claim 3 further defined by multiply activating said slice selection gradient together with said first frequency-selective radio-frequency pulse at respectively different chronological spacings from said first gradient pulse.

5. A method as claimed in claim 1 comprising the additional step of:

activating a second radio-frequency pulse having a flip angle of 180° following said first radio-frequency pulse but still during the influence of said slice selection gradient for producing a spin echo signal as said nuclear magnetic resonance signal.

6. A method as claimed in claim 1 wherein said first radio-frequency pulse comprises a 90° pulse.

7. A method as claimed in claim 1 comprising the additional steps of:

conducting steps (b) through (e) twice for each selected slice with respectively different operational signs of said first gradient pulse to obtain one of a first frequency curve or a first phase curve with said gradient pulse at one operational sign and to obtain a second frequency curve or a second phase curve with said first gradient pulse at said second operational signal; and calculating said eddy current magnetic field from one of a difference between said first frequency curve and said second frequency curve or a difference between said first phase curve and said second phase curve.

8. A method as claimed in 1 comprising the additional steps, for eliminating effects of inhomogeneities in a basic magnetic field of said nuclear magnetic resonance apparatus, of:

activating a slice-selective radio-frequency pulse for each selected slice under said influence of said slice selection gradient;

measuring the frequency of said nuclear magnetic resonance signal after the decay of said eddy currents caused by said slice selection gradient; and identifying said basic magnetic field in each selected slice from said frequency and employing the identified basic magnetic field in the calculation for identifying said eddy current magnetic field.

9. A method as claimed in claim 8 comprising the additional step of:

successively activating 90° and 180° radio-frequency pulses under the influence of said slice selection gradient.

10. A method as claimed in claim 8 comprising the additional step of generating an inverse gradient, having an opposite operational sign to said slice selection gradient, following each slice selection gradient for compensating eddy currents caused by said slice selection gradient.

11. A method as claimed in claim 1 wherein step (c) is further defined by activating a slice selection gradient together with said first frequency-selective radio-frequency pulse after said first gradient pulse, said slice selection gradient having a duration which is substantially shorter than a duration of said first gradient pulse;

conducting a reference measurement for identifying eddy currents caused by said slice selection gradient with only said slice selection gradient being activated in said reference measurement together with frequency-selective radio-frequency pulses; and calculating an eddy current magnetic field arising from said slice selection gradient from the nuclear magnetic resonance signal arising in said spatially extended phantom as a result of said reference measurement; and adjusting said eddy current magnetic field calculated in step (g) with said eddy current magnetic field obtained from said reference measurement.

* * * * *